United States Patent [19]

Iwamura

[11] Patent Number: 4,635,037
[45] Date of Patent: Jan. 6, 1987

[54] ANALOG TO DIGITAL CONVERTER

[75] Inventor: Jun Iwamura, Yokohama, Japan

[73] Assignee: Tokyo Shibaura Denki Kabushiki Kaisha, Kawasaki, Japan

[21] Appl. No.: 414,912

[22] Filed: Sep. 3, 1982

[30] Foreign Application Priority Data

Sep. 7, 1981 [JP] Japan ................................ 56-140777

[51] Int. Cl.$^4$ ............................................ H03K 13/02
[52] U.S. Cl. ............................ 340/347 AP; 364/807; 328/158
[58] Field of Search ........................ 328/158; 307/498; 364/807; 340/347 AD, 347 AP

[56] References Cited

U.S. PATENT DOCUMENTS

| 2,930,982 | 7/1951 | Paherson | 328/158 |
| 3,148,366 | 12/1962 | Schulz | 340/347 AD |
| 3,478,348 | 11/1969 | Molyneux | 340/347 AP |
| 3,555,298 | 1/1971 | Neelands | 340/347 M |
| 3,666,933 | 5/1972 | Grobert | 307/498 |
| 3,725,905 | 4/1973 | Tunzi | 340/347 AD |
| 3,801,834 | 4/1974 | Lai | 340/347 AP |

OTHER PUBLICATIONS

Hnatek, *A User's Handbook of D/A and A/D Converters*, 1976, pp. 246–247.

Greenfield, *Practical Digital Design Using IC's*, 1977, p. 144.

NIKKEI Electronics: "8-Bit MOS IC A-D Converter Using an Electric Charge Balanced Type Comparator", Thomas P. Ledfern et al. Jan. 21, 1980, pp. 159–169.

NIKKEI Electronics: "MOS Analog Circuit Technique Exhibiting Its Full Power for an Analog-Digital Hybrid LSI", K. Haruyama et al., Oct. 27, 1980, pp. 152–177.

*Primary Examiner*—John W. Caldwell, Sr.
*Assistant Examiner*—Donna Angotti
*Attorney, Agent, or Firm*—Finnegan, Henderson, Farabow, Garrett & Dunner

[57] ABSTRACT

An analog to digital converter comprising a data strobe terminal to which a signal is supplied upon the start of the converting operation, a delay circuit having a transistor with controlled conduction resistance and having its gate supplied with an analog input signal, an EX-OR gate having a first input terminal connected to the data strobe terminal and a second input terminal connected to the data strobe terminal through the delay circuit, an AND gate to which the output signal of the EX-OR gate and a clock pulse are supplied, and a counter for counting the output signal of the AND gate, whereby to produce the output of the counter as a digital signal.

20 Claims, 12 Drawing Figures

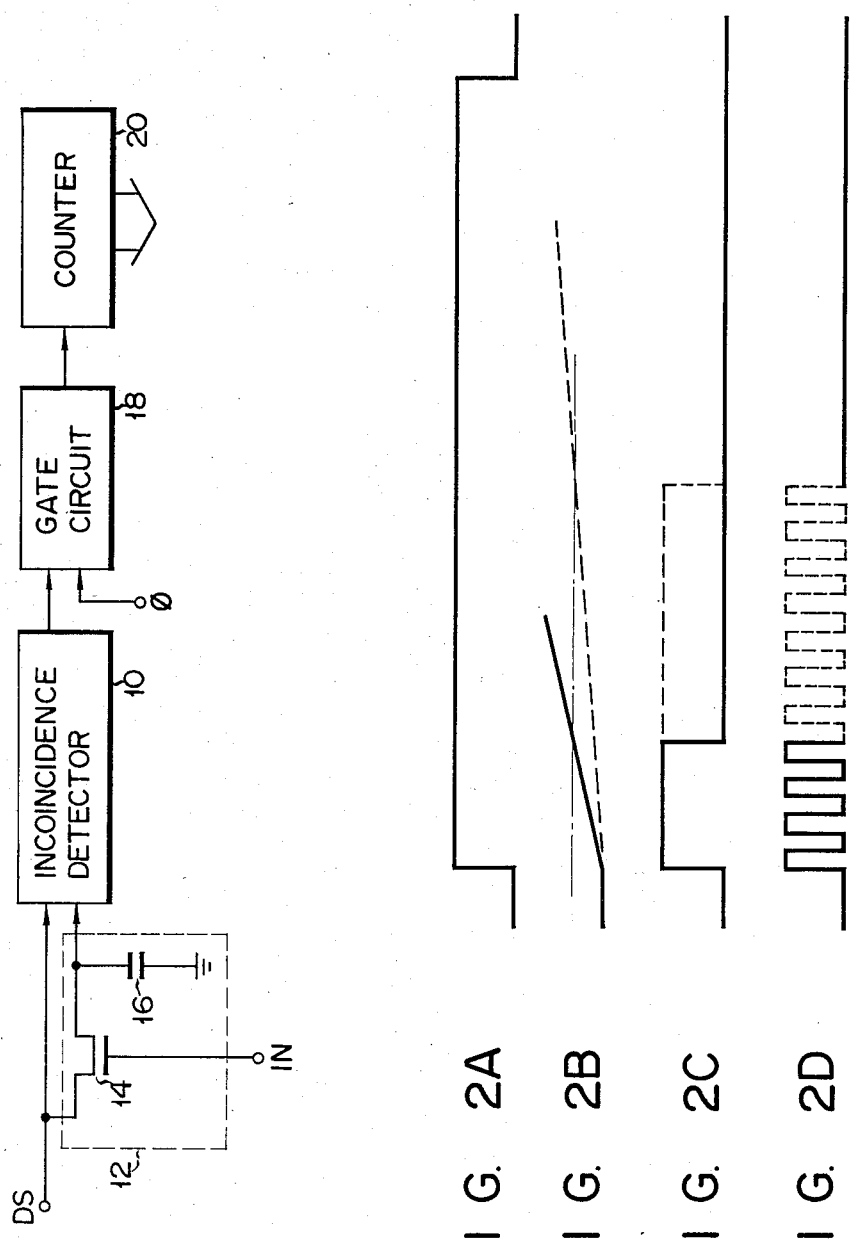

F I G. 3
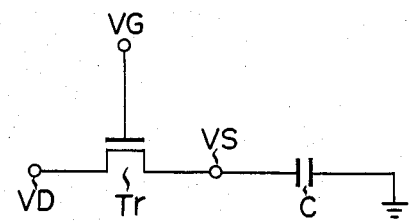
F I G. 4
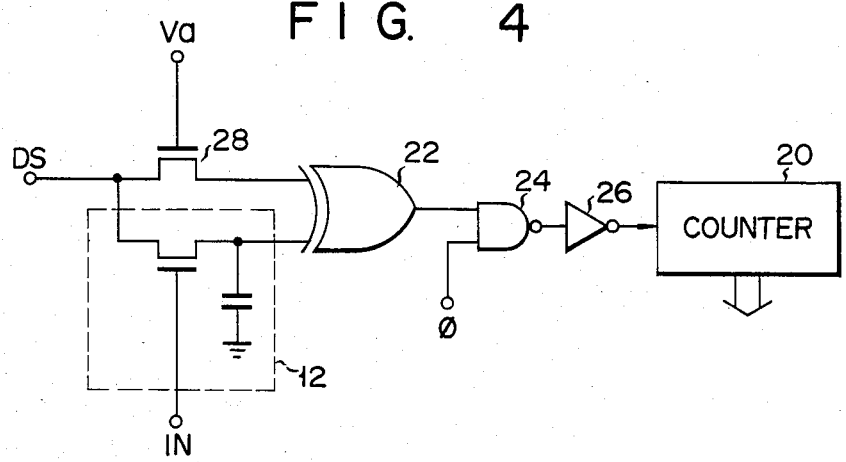
F I G. 6
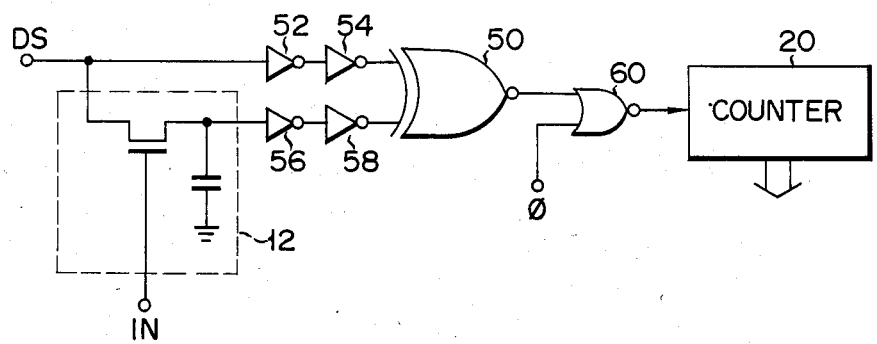

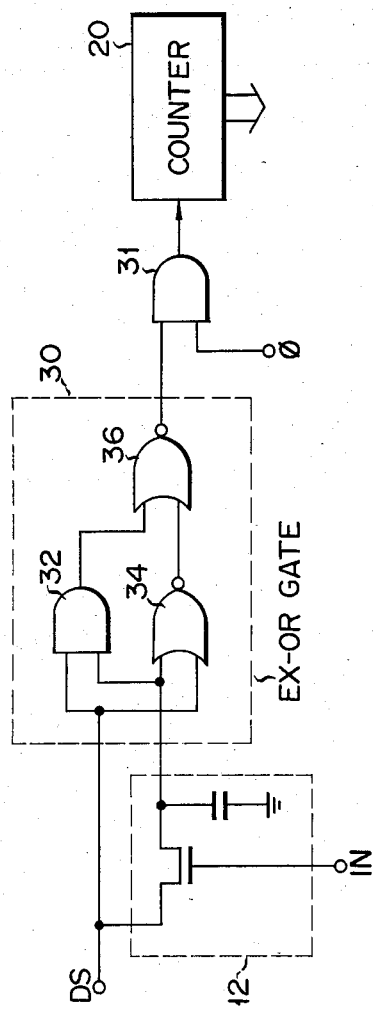
F I G. 5A
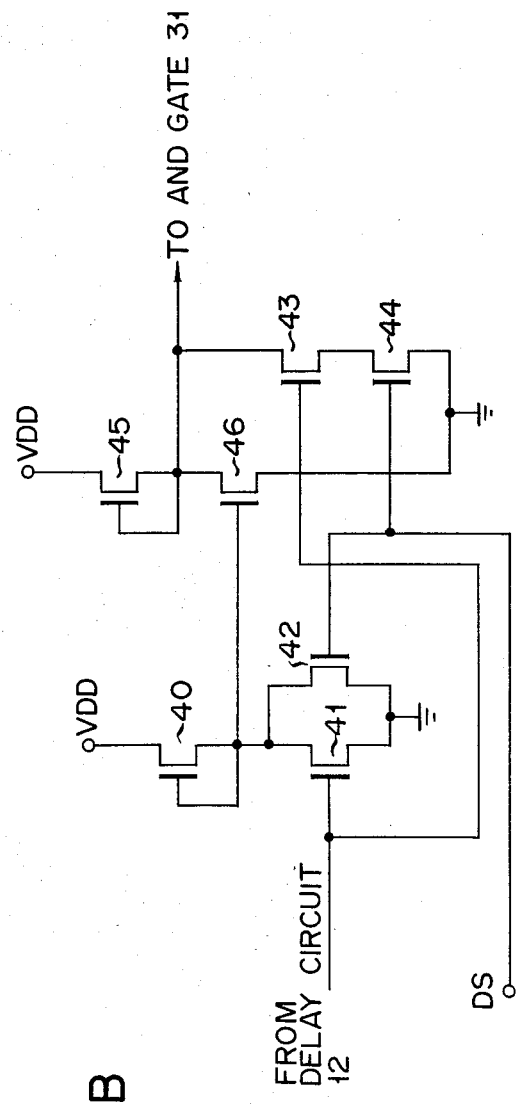
F I G. 5B

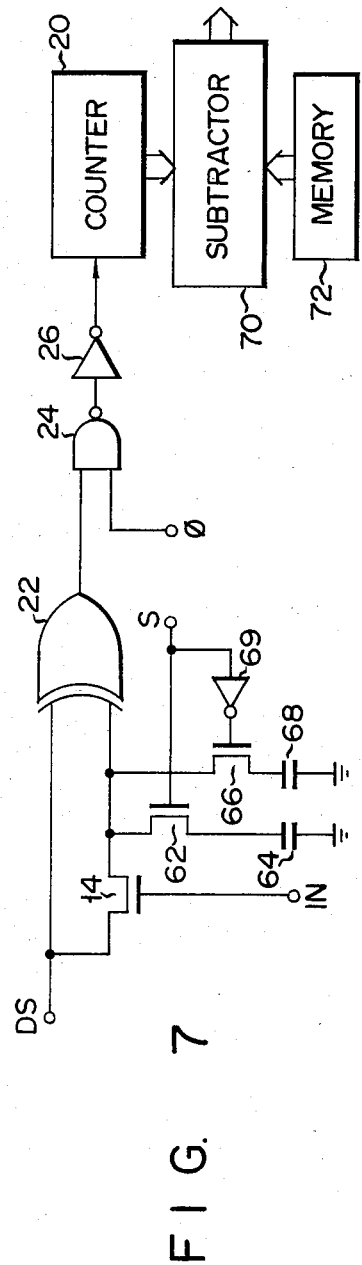
F I G. 7
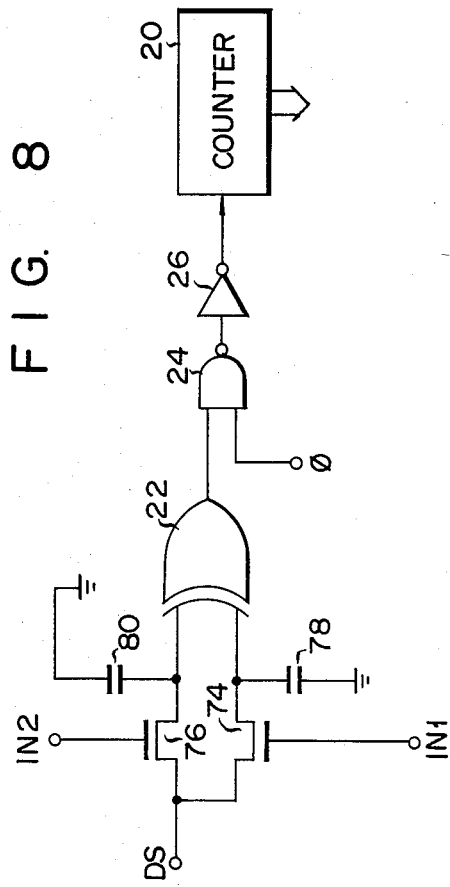
F I G. 8

ANALOG TO DIGITAL CONVERTER

BACKGROUND OF THE INVENTION

This invention relates to an analog to digital converter.

A general type of prior art analog to digital converter is based on the combined use of a ladder-type resistor network and switching elements. The ladder-type resistor network occupies a large area and requires high precision in its electrical operability. In addition, the network necessitates a high-precision reference power source and therefore is not suitable for an integrated circuit.

SUMMARY OF THE INVENTION

The object of the invention is to provide an analog to digital converter which can be highly integrated by a simple process technique and which can be easily made integral with a digital circuit of, for example, a microprocessor.

The above object can be achieved by an analog to digital converter comprising an integrating circuit whose time constant is determined by an analog input signal, a detector for detecting the time constant of the integrating circuit, a circuit for generating a pulse signal during only the period corresponding to the output signal from the detector representing the time constant detected, and a counter for counting the number of pulses generated from the pulse signal generating circuit.

BRIEF DESCRIPTION OF THE DRAWING

FIG. 1 is a circuit diagram of an embodiment of an analog to digital converter according to the invention;

FIGS. 2A to 2D are timing charts showing the operation of the embodiment shown in FIG. 1;

FIG. 3 is a delay circuit diagram for explaining the principle of the embodiment shown in FIG. 1;

FIG. 4 is a circuit diagram of a second embodiment of the analog to digital converter according to the invention;

FIG. 5A is a circuit diagram of a third embodiment of the analog to digital converter according to the invention;

FIG. 5B is a circuit diagram of an exclusive OR gate shown in the third embodiment illustrated in FIG. 5A;

FIG. 6 is a circuit diagram of a fourth embodiment of the analog to digital converter according to the invention;

FIG. 7 is a circuit diagram of a fifth embodiment of the analog to digital converter according to the invention; and FIG. 8 is a circuit diagram of a sixth embodiment of the analog to digital converter according to the invention.

DETAILED DESCRIPTION OF THE PREFERRED EMBODIMENTS

FIG. 1 is a circuit diagram of an embodiment of an analog to digital converter according to the invention. Upon the start of the converting operation, a data strobe signal is supplied to a data strobe terminal DS, which is connected directly to a first input terminal of an incoincidence detector 10 and is also connected to a second input terminal thereof through a ramp signal generator circuit 12. As used herein, "incoincidence detector" means a circuit which produces an output only when its inputs are different, e.g., the exclusive OR function.

The ramp signal generator circuit 12 is comprised of a capacitor 16 and a MOS transistor 14 having its gate connected to an analog input terminal IN. MOS transistor 14 is rendered conductive or nonconductive in accordance with the analog input signal. The second input terminal of the incoincidence detector 10 is grounded through the capacitor 16.

The output signal from the incoincidence detector 10 is supplied as a gate control signal to a gate circuit 18. This gate circuit 18 is controlled in accordance with the gate control signal to supply a clock signal $\phi$ to a counter 20. The binary signal produced from the counter 20 is the subject output signal of the present analog to digital converter.

The operation of the embodiment illustrated in FIG. 1 will now be described with reference to the signal waveforms shown in FIGS. 2A to 2D, wherein FIG. 2A shows data strobe input DS, FIG. 2B shows the output of circuit 12, FIG. 2C shows the output of circuit 10, and FIG. 2D shows the output of gate 18. The analog input terminal IN is supplied with an analog signal. From the start of the converting operation, the data strobe signal has a logical '1' level as shown in FIG. 2A. Although not shown, the clock signal $\phi$ can be generated before the start of the converting operation.

At the first input terminal of the incoincidence detector 10, the data strobe signal has a logical '1' level as does the data strobe terminal DS. However, since the second input terminal of the incoincidence detector 10 is connected to the data strobe terminal DS through the ramp signal generator circuit 12, the signal at the second input terminal has a signal level increasing by degrees as shown in FIG. 2B. For this reason, when the data strobe signal the output signal of the incoincidence detector 10 as shown in FIG. 2C is a logical '1' level representing the incoincidence of the two inputs to detector 10.

When the output of incoincidence detector 10 is a logical '1' level, gate circuit 18 has its gate opened to provide to the counter 20 the clock signal $\phi$ as shown in FIG. 2D. When the second input signal of the incoincidence detector 10, i.e., the output signal of the ramp signal generator circuit 12, shown in FIG. 2B increases to reach a threshold level of the incoincidence detector 10 indicated by a one-dot chain line in FIG. 2B, the output signal of the incoincidence detector 10 is a logical '0' level, as shown in FIG. 2C representing the coincidence of the two inputs to detector 10. Thus, the gate circuit 18 is closed and, as shown in FIG. 2D, ceases to provide the clock signal $\phi$. The clock signal $\phi$ produced from the gate circuit 18 is converted, by the counter 20, into a binary signal.

The time period in which the output signal of the incoincidence detector 10 has a logical '1' level is determined depending upon the RC time-constant determined by the product of the capacitance C of the capacitor 16 and the conducting resistance R of the MOS transistor 14 of the ramp signal generator circuit 12. Since the analog input terminal IN is connected to the gate of the MOS transistor 14, the conduction resistance R thereof is determined by the level of the analog input signal. Thus, the number of pulses of the clock signals supplied from the gate circuit 18 to the counter 20 is determined by the level of the analog input signal.

Assume by way of example that the level of the analog input signal is lower than that mentioned in connection with the foregoing explanation. Then, the conduction resistance R of the MOS transistor 14 increases with the result that the output signal of the ramp signal generator circuit 12 has a gentle rise, as indicated by a broken line of FIG. 2B. For this reason, as shown by the broken line of FIG. 2C, the time period in which the incoincidence detector 10 detects that two inputs are not coincident is increased. As a result, as indicated by the broken line of FIG. 2D, the number of pulses of the clock signals φ supplied to the counter 20 increases.

Now an explanation will be made with a mathematical formula for the time period t required for the output signal of the ramp signal generator circuit 12 to vary from the logical '0' level to the threshold level of the incoincidence detector 10. For brevity, the ramp signal generator circuit 12 is expressed as shown in FIG. 3.

The current i allowed to flow in the grounding terminal from the drain of the transistor Tr in FIG. 3 is given by the equation:

$$i = C \frac{dV}{dt} \quad (1)$$

where C represents the capacitance of the capacitor, t the time period, and V the voltage applied to the capacitor, i.e., the source voltage VS.

Accordingly, the time period t required for the potential VS at the connection point between the transistor Tr and the capacitor to rise from the V1 level to the V2 level is expressed as follows by rewriting the equation (1) and integrating the resultant equation.

$$t = C \int_{V1}^{V2} \frac{dV}{i} \quad (2)$$

Generally, the current i allowed to flow through an MOS transistor can be expressed as follows.

Where the transistor has a pentode operation (VD ≧ VG−VT), $$i = \beta(VG - VT - VS)^2 \quad (3)$$

Where the transistor has a triode operation (VD < VG−VT), $$i = \beta(2VG - 2VT - VD - VS)(VD - VS) \quad (4)$$

where $$\beta = \frac{1}{2} \cdot \mu \cdot \frac{\epsilon}{T} \cdot \frac{W}{L}$$

VD: the drain voltage
VG: the gate voltage
VS: the source voltage
VT: the threshold voltage
μ: the carrier mobility
T: the gate insulating film thickness
ε: the dielectric constant of the gate insulating film
L: the channel length
W: the channel width When the above equations (3) and (4) are substituted into the equation (2), the following equations are obtained.

Where the transistor has a pentode operation, $$t = C \int_{V1}^{V2} \frac{dVS}{\beta(VG - VT - VS)^2} \quad (5)$$

$$= \frac{C}{\beta} \left[ \frac{-1}{-(VG - VT - VS)} \right]_{V1}^{V2}$$

$$= \frac{C}{\beta} \cdot \frac{V2 - V1}{(VG - VT - V2)(VG - VT - V1)}$$

Where the transistor has a triode operation, $$t = C \int_{V1}^{V2} \frac{dVS}{\beta(2VG - 2VT - VD - VS)(VD - VS)} \quad (6)$$

$$= \frac{C}{\beta} \left[ \left( \frac{1}{-VD + (2VG - 2VT - VD)} \right) \cdot \right.$$

$$\left. \ln\left( \frac{2VG - 2VT - VD - VS}{VD - VS} \right) \right]_{V1}^{V2}$$

$$= \frac{C}{\beta} \cdot \frac{1}{2(VG - VT - VD)} \cdot$$

$$\ln \frac{(2VG - 2VT - VD - V2)(VD - V1)}{(VD - V2)(2VG - 2VT - VD - V1)}$$

In order to bring the circuit shown in FIG. 3 into corresponding relationship to the circuit shown in FIG. 1, the following relations should be established.
VG=Vin (analog input voltage)
VD=Vo (the voltage of the data strobe signal having a logical '1' level)
V1=Vl (the voltage of the data strobe signal having a logical '0' level)
V2=Vm (the threshold level of the incoincidence detector 10, the level indicated by the one-dot chain line of FIG. 2B)
C=the capacitance of the capacitor 16
Consequently, the output pulse width t of the incoincidence detector 10 can be expressed as follows.

Where the transistor 14 has a pentode operation (Vo ≧ Vin−VT), $$t = \frac{C}{\beta} \cdot \frac{Vm - Vl}{(Vin - VT - Vm)(Vin - VT - Vl)} \quad (7)$$

Where the transistor 14 has a triode operation (Vo < Vin−VT), $$t = \frac{C}{\beta} \cdot \frac{1}{2(Vin - VT - Vo)} \cdot \quad (8)$$

$$\ln \frac{(2Vin - 2VT - Vo - Vm)(Vo - Vl)}{(Vo - Vm)(2Vin - 2VT - Vo - Vl)}$$

It will be understood from the above that when the analog input voltage Vin decreases in level, the output pulse width t increases. That is to say, in the circuit shown in FIG. 1, the binary output value of the counter 20 varies in accordance with the analog input signal. Thus the circuit of FIG. 1 operates as an analog to digital converter.

As mentioned above, the lower the level of the analog input signal, the greater the number of the pulses supplied to the counter 20. Therefore, if the counter 20 is constructed as a down-counter, a binary data from this counter will be obtained in proportion to the level of the analog input signal.

Next explanations will be made of the other embodiments wherein the construction of the analog to digital converter of the invention is shown in detail. Note here that the portions in the remaining Figures corresponding to those of FIG. 1 are denoted by the same reference numerals as in FIG. 1.

In the second embodiment shown in FIG. 4, an exclusive OR gate (hereinafter referred to simply as "EX-OR gate") 22 is used as the incoincidence detector, while a NAND gate 24 and an inverter 26 are used as the gate circuit. In the above-mentioned first embodiment shown in FIG. 1, where the analog signal has a high level, the output pulse width of the incoincidence detector 10 becomes small. However, even if the analog signal is at the maximum level, the time constant of the ramp signal generator 12 is not made zero. Therefore, the output signal of the incoincidence detector 10 necessarily has a logical '1' level for a very short period of time. To compensate for this the second embodiment is constructed so that the data strobe signal is supplied to the first input terminal of the incoincidence detector through a delay element for delaying a period of time equal to the value of time constant of the ramp signal generator 12 when the analog signal is at the maximum level. In this second embodiment, therefore, when the analog signal is at the maximum level, the output signal of the incoincidence detector 10 does not have a logical '1' level with a result that the counter 20 does not carry out the counting operation.

Specifically, as shown in FIG. 4, the data strobe terminal DS is connected to the first and second input terminals of the EX-OR gate 22 through an MOS transistor 28 and through the ramp signal generator circuit 12, respectively. The output terminal of the EX-OR gate 22 is connected to the counter 20 through the NAND gate 24 and the inverter 26 connected in series. The clock signal $\phi$ is supplied to the NAND gate 24. To the gate of the transistor 28 is applied a prescribed gate voltage Va, thereby controlling the conduction resistance of the transistor 28.

According to the second embodiment, the data strobe signal supplied to the first input terminal of the EX-OR gate 22 is also subjected to time delay. Thus, by setting this length of delay time to a value equal to the time constant the ramp signal generator 12 when the analog signal is at the maximum level, no pulse is generated from the NAND gate 24 when the analog signal is at the maximum level. A resistor may be also used as the element 28; however, the use of a transistor has the merit of making the time constant variable which is effective where the maximum value of the analog signal is varied.

A third embodiment, shown in FIG. 5A, also uses an EX-OR gate 30 as the incoincidence detector. This embodiment, however, obtains the same effect as in the preceding embodiment by controlling the logical threshold level of the EX-OR gate 30 instead of providing the element 28. Note here that an AND gate 31 is used as the gate circuit.

The EX-OR gate 30 is comprised of an AND gate 32 and two NOR gates 34, 36. The data strobe terminal DS is connected to the first input terminals of the AND gate 32 and NOR gate 34, while the output terminal of the integrating circuit 12 is connected to the second input terminals of the AND gate 32 and NOR gate 34. The output signals of the AND gate 32 and NOR gate 34 are supplied to the AND gate 31 through the NOR gate 36.

The EX-OR gate 30 is constructed as shown in FIG. 5B. The transistors 40 to 42 correspond to the NOR gate 34, the transistors 43 and 44 to the AND gate 32, and the transistors 43, 45 and 46 to the NOR gate 36. In this construction, if the channel width of the transistor 42 is made small and the channel width of the transistor 41 is made large, it is possible that the input terminal of the EX-OR gate 30 at the side of the data strobe terminal DS is set to have a large logical threshold level and the input terminal of that gate 30 at the side of the ramp signal generator 12 is set to have a small logical threshold level. Thus, it becomes possible to make the circuit time difference zero between the signals rising at the first and second input terminals of the EX-OR gate 30 when the analog input signal is at the maximum level.

A fourth embodiment of the analog to digital converter is shown in FIG. 6. It uses an EX-NOR gate 50 as the incoincidence detector. In this embodiment, the data strobe terminal DS is connected to the first input terminal of the EX-NOR gate 50 through inverters 52 and 54 connected in series. The output terminal of the ramp signal generator 12 is connected to the second input terminal of the EX-NOR gate 50 through inverters 56 and 58 connected in series. The output signal of the EX-NOR gate 50 is supplied to a NOR gate 60 together with the clock signal $\phi$, the output signal of which is supplied to the counter 20.

In this fourth embodiment, during the time period in which the data strobe signal has a logical '1' level and the output signal of the ramp signal generator 12 has a logical '0' level, the output signal of the EX-NOR gate 50 has a logical '0' level. During this time period, the output signal from the EX-NOR gate 50 is supplied to the NOR gate 60, which, during only this period, supplies an inverted clock signal $\phi$ to the counter 20. Thus, if the logical threshold level of the inverter 56 is made smaller and the logical threshold level of the inverter 52 is made greater, then the same effect as in the third embodiment is obtained. That is, during the time period in which the analog signal is at the maximum level, upon a rise of the data strobe signal the output signal of the EX-NOR gate 50 has a logical '1' level. Therefore, it is impossible for the clock signal to be supplied to the counter 20 through the NOR gate 60. The inverters 52, 54, 56 and 58 concurrently serve as wave-shapers of the input signal of the EX-NOR gate 50.

FIG. 7 shows a fifth embodiment of the invention. This embodiment differs from the above-mentioned embodiments in respect to the ramp signal generator. The data strobe terminal DS is connected directly to the first input terminal of the EX-OR gate 22 and is also connected to the second input terminal of the same gate through the transistor 14. The second input terminal of the EX-OR gate 22 is grounded through a transistor 62 and a capacitor 64 in series and is also grounded through a transistor 66 and a capacitor 68 in series. A control signal S is supplied directly to the gate of the transistor 62 and is also supplied to the gate of the transistor 66 through an inverter 69. The output signal of the counter 20 is supplied to a first input terminal of a subtractor 70. To a second input terminal of subtractor 70 the output signal of a memory 72 is supplied. The subtractor 70 produces an output signal obtained by subtraction of the second input signal from the first input signal.

In this fifth embodiment, the signals developing at the two input terminals of the EX-OR gate 22 may have equal threshold values. When the analog signal is at the maximum level, the number of pulses supplied to the counter 20 will, if the binary data corresponding to the number of pulses is previously written into the memory 72, be regarded as zero. The output signal of this subtractor 70 is drawn out as a digital signal.

Further, the two capacitors 64 and 68 included in the ramp signal generator differ in respect to capacitance and only one of them is selectively used by controlling the conduction of the transistors 62 and 66 through the use of the control signal S. This provides the following effects. When the capacitance of the capacitor forming the ramp signal generator jointly with the transistor 14 is varied, the CR time constant, i.e., of the ramp signal generator, is varied. For this reason, even if the analog signal voltage is the same, the output pulse width of the EX-OR gate 22 will vary. This means that the output binary data of the counter 20 varies with respect to the same analog signal voltage which in turn means that the resolution of the analog to digital converter varies. In the present invention, the range of the output digital values is determined by the counter values of the counter 20 and therefore is definite. Therefore, when the range of the input analog signal voltage has varied, it becomes necessary to vary the resolution of the converter. This fifth embodiment can easily meet such necessity in such a case.

FIG. 8 shows a sixth embodiment of this invention in which analog signal voltages are supplied as two analog inputs. The necessity to use such inputs arises, for example, where the ground level of the analog signal differs from that of the converter. The data strobe terminal DS is connected to the first and second input terminals of the EX-OR gate 22 through transistors 74 and 76, respectively. Analog input signals IN1 and IN2 are supplied to the transistors 74 and 76, respectively. The first and second input terminals of the EX-OR gate 22 are grounded through capacitors 78 and 80, respectively.

In such a construction, a signal having the pulse width proportional to the signal difference between the analog input signals IN1 and IN2 is produced from the EX-OR gate 22.

As mentioned above, according to the present invention, there is provided an analog to digital converter capable of being highly integrated with a simple construction and a simple process technique, wherein a signal having a pulse width corresponding to the analog signal is obtained by using a simplified ramp signal generator and a digital signal is produced in accordance with this pulse signal.

This invention is not limited to the above-mentioned embodiments, but permits a combined use of these embodiments or a replacement of any one or more circuits employed therein by other circuits having the same function.

What is claimed is:

1. In an A/D conversion circuit responsive to a strobe signal having first and second levels, said circuit operating to generate a digital output proportional to an analog input, the combination comprising:

timing means including a MOS transistor with a gate to which the analog input is supplied, one end of a channel of said MOS transistor being connected to receive said strobe signal the other end of said channel of said MOS transistor connected to a first plate of a capacitor, a second plate of said capacitor grounded, and a capacitor connected to the other end of the channel, said capacitor being charged by said strobe signal in response to the transition of said strobe signal from said first to said second level, said timing means outputting an output signal from a point of connection between said other end of said channel and said first plate of said capacitor;

control means for comparing said strobe signal and said output signal from said timing means, said control means being responsive to the transition of said strobe signal from said first to said second level for generating a counter drive signal and for terminating said counter drive signal when said output signal from said timing means reaches a threshold level while said strobe signal is at said second level; and counter means operated by said counter drive signal to produce said digital output proportional to said analog input.

2. The A/D conversion circuit set forth in claim 1 wherein said control means comprises an incoincidence detector which produces said counter drive signal only when said control means inputs are different.

3. The A/D conversion circuit set forth in claim 2 wherein said incoincidence detector comprises an exclusive OR circuit.

4. The A/D conversion circuit set forth in claim 2, wherein said incoincidence detector includes first and second input terminals, said strobe signal being electrically connected to said first input terminal and said output signal from said timing means being electrically connected to said second input terminal.

5. The A/D conversion circuit set forth in claim 1, wherein said capacitor is variably charged to provide a capacitance to vary in accordance with the range of said analog input, for varying the output signal from said timing means.

6. The A/D conversion circuit set forth in claim 4, in which said strobe signal is electrically connected to said first input terminal of said incoincidence detector through a MOS transistor, whereby said strobe signal is delayed for a time period equal to the time period for the output signal from said timing means to reach said threshold level.

7. The A/D conversion circuit set forth in claim 4, wherein said strobe signal is electrically connected to said first input terminal of said incoincidence detector through first and second inverters connected in series, and the output of said timing means is electrically connected to said second input terminal of said incoincidence detector through third and fourth inverters connected in series, whereby said strobe signal and said output signal from said timing means are delayed before being applied to said first input terminal and said second input terminal of said incoincidence detector.

8. The A/D conversion circuit set forth in claim 1, in which said control means includes an exclusive OR gate and an AND gate to which the output signal of said exclusive OR gate and a clock pulse are supplied, whereby the output of said AND gate supplies said counter drive signal.

9. The A/D conversion circuit set forth in claim 1, in which said control means includes an exclusive NOR gate and a NOR gate to which the output signal of said exclusive NOR gate and a clock pulse are supplied.

10. An A/D conversion circuit responsive to a strobe signal for generating a digital output proportional to an analog input comprising:

ramp output signal generating means including means for providing a variable resistance and a variable capacitance controlled to vary in accordance with said analog input, for integrating said strobe signal through said variable resistance and said variable capacitance to generate a ramp output signal;

said variable resistance being a transistor with a gate to which said analog input is supplied;

control means responsive to said strobe signal and to said ramp output signal for generating a counter drive signal on initiation of said strobe signal and for terminating said counter drive signal when said ramp output signal reaches a predetermined level; and counter means operated by said counter drive signal to produce said digital output proportional to said analog input.

11. The A/D conversion circuit set forth in claim 10 wherein said control means comprises an incoincidence detector which produces said counter drive signal only when said ramp output signal is at a level below that of said strobe signal.

12. The A/D conversion circuit set forth in claim 11 wherein said incoincidence detector comprises an exclusive OR circuit.

13. The A/D conversion circuit set forth in claim 11, wherein said incoincidence detector includes first and second input terminals, said strobe signal being applied to said first input terminal and said ramp output signal being applied to said second terminal.

14. The A/D conversion circuit set forth in claim 13, in which said ramp output signal generating means includes a transistor rendered conductive according to said analog input and connected to receive said strobe signal and to supply said second input terminal of said incoincidence detector, and a capacitor connected between said second input terminal of said incoincidence detector and ground.

15. The A/D conversion circuit set forth in claim 14, in which said transistor is an MOS transistor.

16. The A/D conversion circuit set forth in claim 14, in which the capacitor is variably charged in accordance with the range of said analog input, for varying said ramp output signal.

17. The A/D conversion circuit set forth in claim 13, in which said strobe signal is connected to said first input terminal of said incoincidence detector through a MOS transistor, whereby said strobe signal is delayed for a time period equal to the duration of said ramp output signal.

18. The A/D conversion circuit set forth in claim 11, in which said strobe signal is electrically connected to said first input terminal of said incoincidence detector through first and second inverters connected in series and the output of said ramp signal generating means to said second input terminal of said incoincidence detector through third and fourth inverters connected in series, whereby said strobe signal and said ramp output signal are delayed before being applied to said first input terminal and said input terminal of said incoincidence detector.

19. The A/D conversion circuit set forth in claim 10, in which said control means includes an exclusive OR gate and an AND gate to which the output signal of said exclusive OR gate and a clock pulse are supplied, whereby the output of said AND gate supplies said counter drive signal.

20. The A/D conversion circuit set forth in claim 10, in which said control means includes an exclusive NOR gate and a NOR gate to which the output signal of said exclusive NOR gate and a clock pulse are supplied.

* * * * *